United States Patent
Baskaran

(10) Patent No.: US 9,061,890 B2
(45) Date of Patent: Jun. 23, 2015

(54) METHODS OF FORMING BURIED ELECTROMECHANICAL STRUCTURES COUPLED WITH DEVICE SUBSTRATES AND STRUCTURES FORMED THEREBY

(71) Applicant: Intel Corporation, Santa Clara, CA (US)

(72) Inventor: Rajashree Baskaran, Seattle, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/798,600

(22) Filed: Mar. 13, 2013

(65) Prior Publication Data

US 2014/0264643 A1   Sep. 18, 2014

(51) Int. Cl.
| | |
|---|---|
| *H01L 29/40* | (2006.01) |
| *H01L 21/00* | (2006.01) |
| *H01L 29/84* | (2006.01) |
| *B81C 1/00* | (2006.01) |
| *B81B 7/02* | (2006.01) |
| *H01L 23/31* | (2006.01) |

(52) U.S. Cl.
CPC .............. *B81C 1/00015* (2013.01); *B81B 7/02* (2013.01); *H01L 2924/00* (2013.01); *H01L 23/315* (2013.01)

(58) Field of Classification Search
CPC .............. H01L 2924/00; H01L 2924/1461; H01L 2224/94; H01L 21/56; H01L 23/315; B81C 1/00246; B81C 2203/0145; B81C 1/00261; B81C 1/00293; B81C 1/0023; B81C 1/00269; B81C 2203/0735; B81C 2203/0118

USPC ............... 257/433, 530, 787, 788, 410–420; 438/5, 51, 52, 55, 106
See application file for complete search history.

(56) References Cited

U.S. PATENT DOCUMENTS

| | | | |
|---|---|---|---|
| 7,344,907 B2* | 3/2008 | Colgan et al. .................. 438/51 |
| 7,898,046 B2* | 3/2011 | Ulm et al. ..................... 257/415 |
| 7,923,790 B1* | 4/2011 | Quevy et al. .................. 257/415 |
| 2004/0178473 A1 | 9/2004 | Dentry et al. | |
| 2004/0262645 A1* | 12/2004 | Huff et al. ..................... 257/232 |
| 2006/0252229 A1 | 11/2006 | Joly et al. | |
| 2007/0042521 A1 | 2/2007 | Yama | |
| 2008/0050845 A1* | 2/2008 | Ulm et al. ........................ 438/5 |
| 2008/0050861 A1* | 2/2008 | Vancura et al. ............... 438/127 |

(Continued)

OTHER PUBLICATIONS

IEEE Transactions on Advanced Packaging, vol. 26, No. 3, Aug. 2003, pp. 227-232 Single Wafer Encapsulation of MEMS Devices Rob N. Candler, Student Member, IEEE, Woo-Tae Park, Huimou Li, Gary Yama, Aaron Partridge, Markus Lutz, and Thomas W. Kenny, Member, IEEE.*

(Continued)

*Primary Examiner* — Marcos D. Pizarro
*Assistant Examiner* — Nelson Garces
(74) *Attorney, Agent, or Firm* — Blakely, Sokoloff, Taylor & Zafman LLP

(57) ABSTRACT

Methods of forming integrated MEMS structures are described. Those methods and structures may include forming at least one MEMS structure on a first substrate, forming a first bonding layer on a top surface of the first substrate, and then coupling the first bonding layer disposed on the first substrate to a second substrate, wherein the second substrate comprises a device layer. The bonding may comprise a layer transfer process, wherein an integrated MEMS device is formed.

14 Claims, 12 Drawing Sheets

(56) References Cited

U.S. PATENT DOCUMENTS

| | | | |
|---|---|---|---|
| 2008/0122020 A1* | 5/2008 | Metz et al. | 257/415 |
| 2008/0160723 A1 | 7/2008 | Hannebauer | |
| 2008/0318360 A1* | 12/2008 | Chen et al. | 438/106 |
| 2011/0073967 A1 | 3/2011 | Chen et al. | |
| 2012/0223613 A1* | 9/2012 | Hung et al. | 310/300 |

OTHER PUBLICATIONS

International Search Report and Written Opinion for PCT/US2014/025522, International filing Mar. 13, 2014, mailed Jul. 8, 2014, 17 pages.

\* cited by examiner

METHODS OF FORMING BURIED ELECTROMECHANICAL STRUCTURES COUPLED WITH DEVICE SUBSTRATES AND STRUCTURES FORMED THEREBY

BACK GROUND OF THE INVENTION

As microelectronic technology advances for higher performance, increasing number of sensors, such as accelerometers, gyroscopes and compasses, for example, are being used in such applications as mobile phones and tablets. Many different types of microelectronic devices/chips, such as complementary metal oxide semiconductor (CMOS) chips, for example, may be used together with such sensors in many computing and communication platforms.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
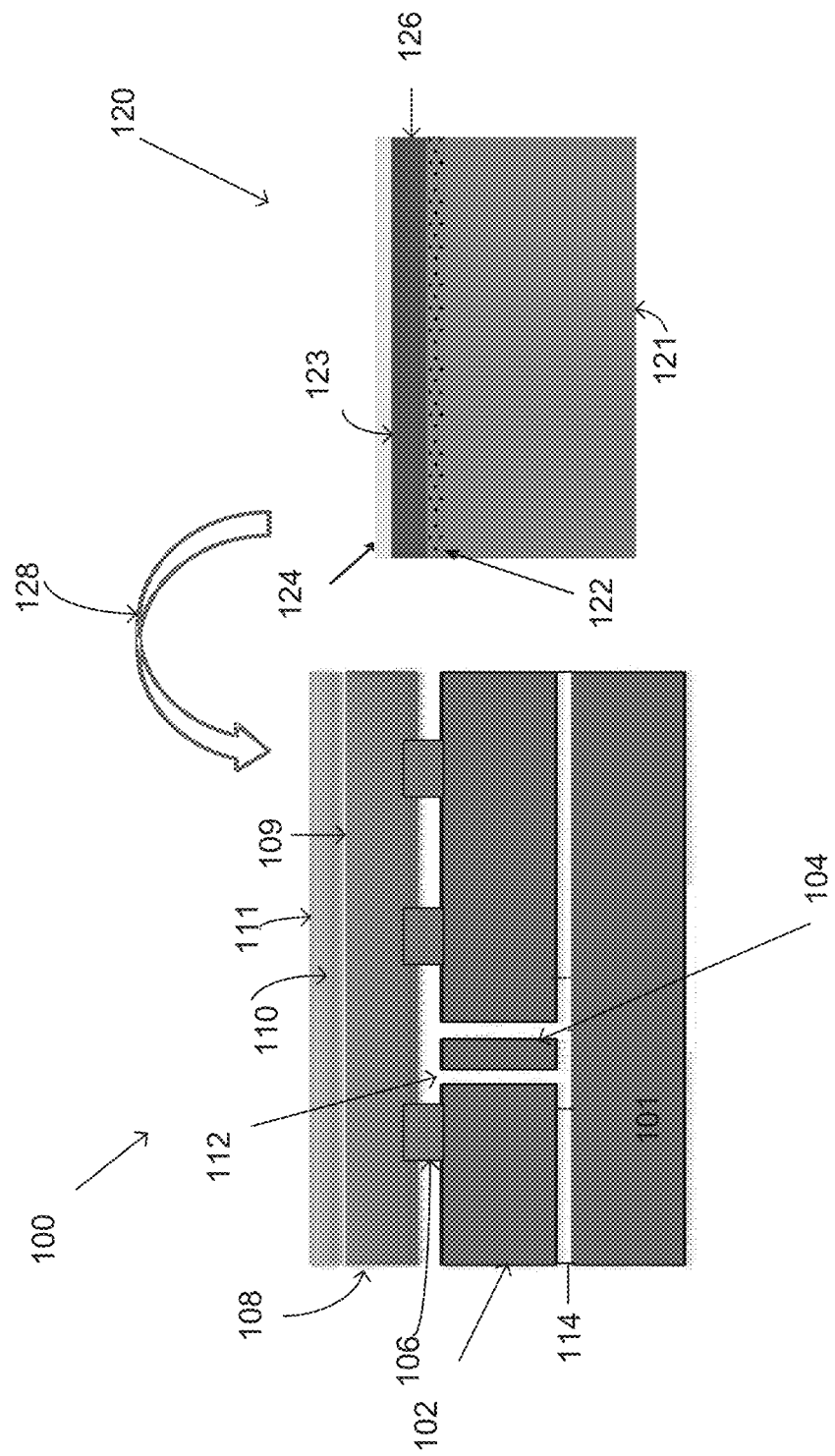
FIGS. 1a-1b represent cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as integrated microelectromechanical systems (MEMS) structures, are described. Those methods/structures may include forming at least one MEMS structure on a first substrate, forming a first bonding layer on a top surface of the first substrate, and then coupling the first bonding layer disposed on the first substrate to a second substrate, wherein the second substrate comprises a device layer. The bonding may comprise a layer transfer process, wherein an integrated MEMS device is formed. The integrated MEMS structures of the various embodiments disclosed herein enable the decoupling of sensor fabrication from chip/device fabrication.

Figure 1B:
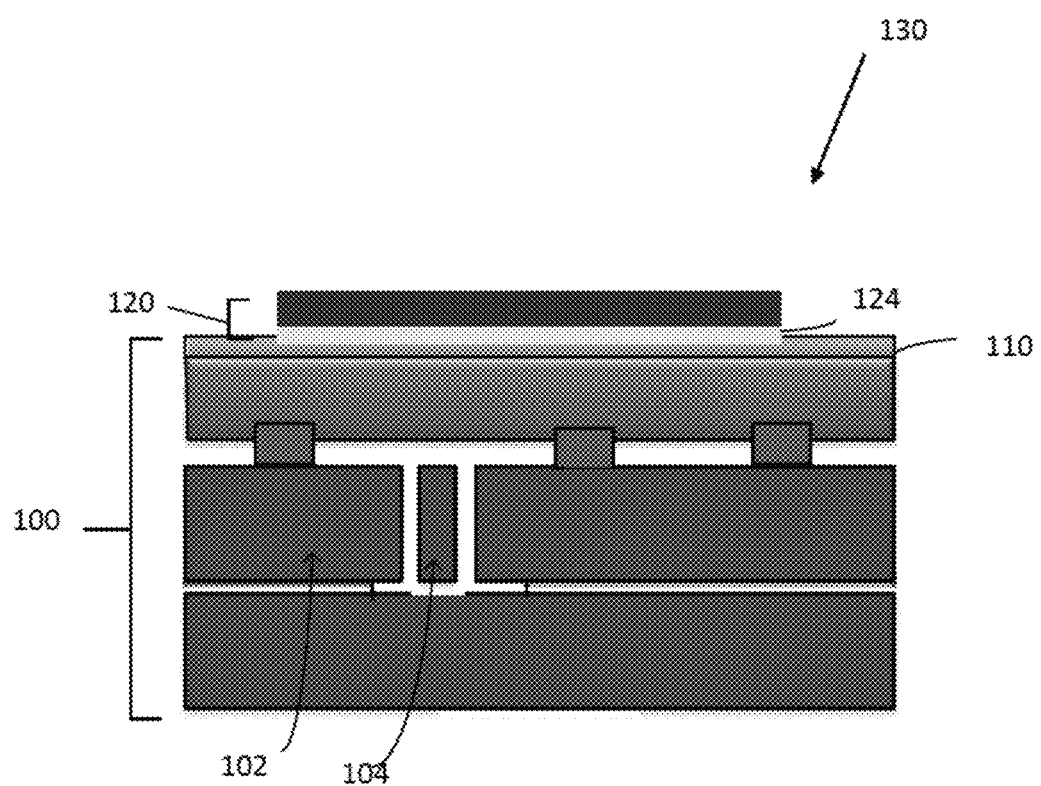

FIGS. 1a-1b illustrate cross-sectional views of embodiments of forming microelectronic structures, such as integrated MEMS structures. In an embodiment, a first substrate 100 may comprise any suitable material with which to form at least one MEMS structure. In an embodiment, the first substrate 100 may comprise at least one of a silicon on insulator material, a non-silicon material, a single crystal silicon material, a polysilicon material, a piezoelectric material and/or other electromechanical transduction sensitive material. The substrate 100 may comprise a fixed element 102, and a moveable element 104. The fixed element 102 may be fixed to a lower portion 101 of the first substrate 100 by the use of an adhesion layer 114.

The moveable element 104 and the fixed element 102 may comprise portions of a MEMS device(s), wherein the MEMS device may comprise at least one of a sensor, a microsensor, a resonator, an actuator, a microactuator, a transducer, a gyroscope, an accelerometer, and a compass, for example. The first substrate 100 may comprise at least one of any type of MEMS structure, according to a particular application. In general MEMS technology refers to very small or miniaturized mechanical and electro-mechanical devices driven by electricity. The MEMS structures of the first substrate may be formed by any suitable fabrication processes. There may be at least one MEMS devices/structures, and in some cases there may be a plurality of MEMS structures disposed within the first substrate 100, although for purposes of illustration portions of one MEMS is depicted in the figures.

The first substrate 100 may further comprise at least one pillar structure 106. An upper portion 108 of the first substrate 100 may be disposed on the pillar 106. In an embodiment, the upper portion 108 and the pillar 106 may comprise a high temperature material, such as an epitaxially grown material, for example. In an embodiment, the pillar and upper portion 106, 108 may comprise an epitaxially grown silicon material. In an embodiment, the upper portion 108 of the first substrate 100 may hermetically seal the at least one MEMS device of the first substrate 100. In an embodiment, the upper portion 108 may surround the perimeter of the MEMS structure 130.

The first substrate 100 may further comprise a first bonding layer 110, that may be disposed on a top surface 109 of the upper portion of the substrate 108. In an embodiment, the first bonding layer 110 may be disposed over substantially the entire top surface 109 of the upper portion 108 of the first substrate 100. In an embodiment, a gap 112 may exist between the lower portion 101 and the upper portion 108 of the first substrate 100. In an embodiment, a second substrate 120 may comprise a donor portion 121, an implanted region 122, and a device layer 126, wherein the device layer 126 may comprise any type of device, such as a microelectronic device/die and a CMOS device/chip.

The device layer 126 may comprise circuitry elements such as transistor structures including trigate and nanowire transistor structures, and any other suitable circuitry elements. The circuitry elements may comprise logic circuitry for use in a processor die, for example. Metallization layers and insulative material may be included in the device layer 126, as well as conductive contacts/bumps that may couple metal layers/interconnects to external devices. In an embodiment, the bumps may comprise copper. In an embodiment, the second substrate 120 may further comprise a second bonding layer 124. In an embodiment, the second bonding layer 124 may comprise any type of material that may be bonded to the first bonding layer 110 of the first substrate 100. In an embodiment, the second bonding layer 124 may be disposed over an entire top surface 123 of the device layer 126. In an embodiment, a layer transfer process 128, which may comprise an oxide to oxide or a metal to metal bonding process, for example, may be employed to bond the first substrate 100 to the second substrate 120 to form an integrated MEMS structure 130 (FIG. 1b). In an embodiment, the second bonding layer 224 may be directly bonded to the device layer 226, and the device layer 226 may be directly bonded to the first bonding layer 210.

In an embodiment, the integrated MEMS structure/device 130 may comprise the first substrate 100 bonded to the second substrate 120, wherein the first bonding layer 110 of the first substrate 100 is bonded to the second bonding layer 124 of the second substrate 120. In an embodiment, the integrated MEMS structure 130 may comprise any suitable types of material for the first and the second substrates, and may comprise any types and numbers of MEMS devices according to the particular application. For example, in an embodiment, device layer of the second substrate of the integrated MEMS structures 130 may comprise a high voltage integrated circuit (IC) comprising non-silicon materials, and the first substrate 100 may comprise a select sensor. In another embodiment, the device layer of the integrated MEMS structure may comprise a radio frequency (RF) chip.

Figure 2A:
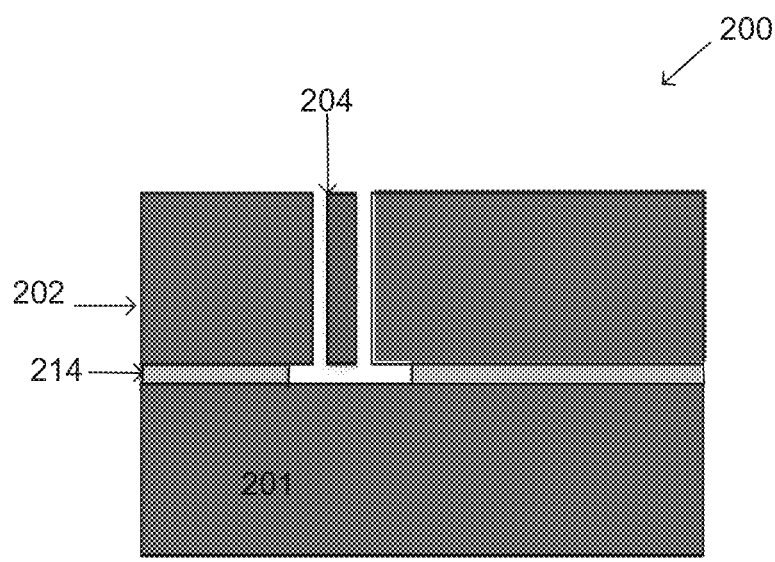
FIGS. 2a-2g represent cross-sectional views of structures according to embodiments.

FIGS. 2a-2g depict cross-sectional views of additional embodiments of forming integrated MEMS structures. In FIG. 2a, a substrate 200, which may comprise a silicon on insulator substrate 200 in an embodiment, may comprise a fixed element 202 and a moveable element 204. The fixed element 202 and the moveable element 204 may comprise portions of at least one MEMS structure/device. In an embodiment, the fixed element 202 may comprise anchors and or electrodes. In an embodiment, the fixed element 202 may be fixed to a lower portion of the substrate 201 by an adhesion layer 214, such as an oxide layer in some cases.

Figure 2B:
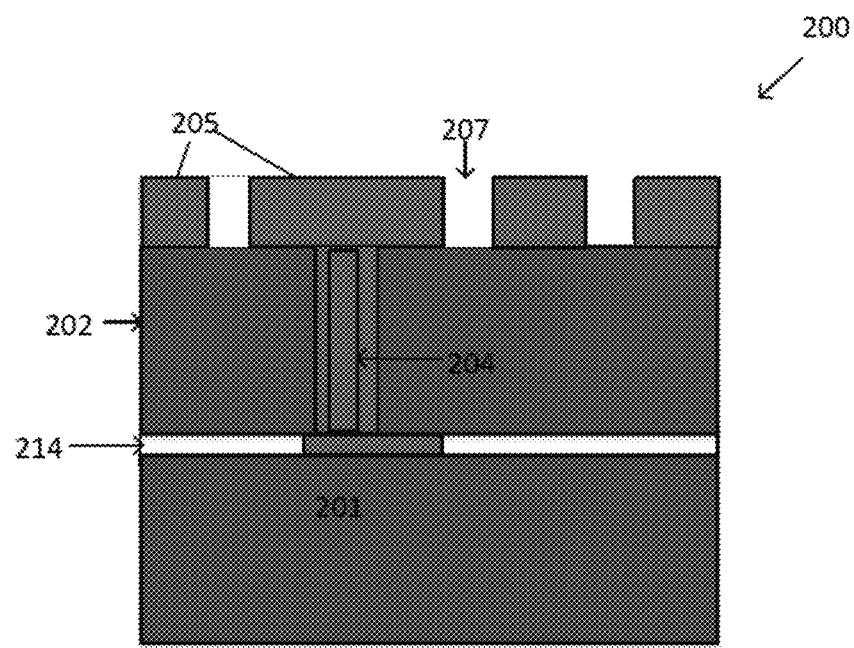
Figure 2C:
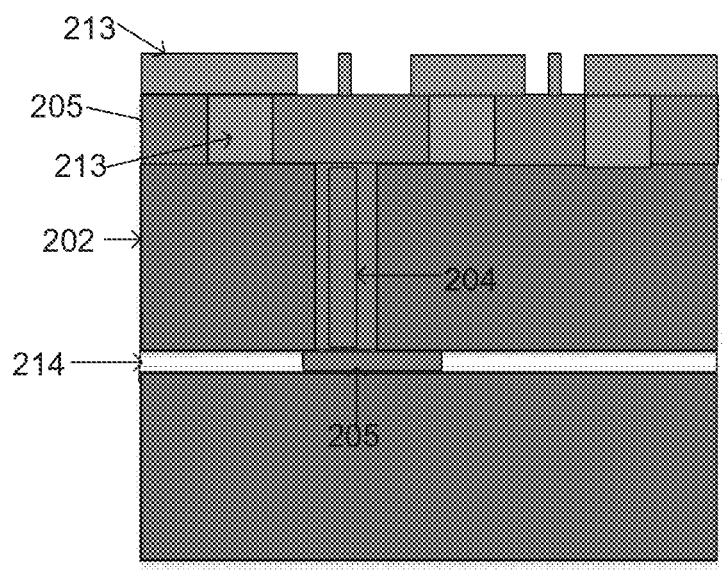

In an embodiment, a sacrificial conformal material 205 may be formed around the moveable element 204 and on a top surface of the substrate 200 (FIG. 2b). The sacrificial conformal layer 205 may comprise a dielectric material, such as an oxide or nitride dielectric material, for example. The sacrificial conformal material 205 may be patterned and etched using any suitable patterning and etching techniques, to form openings 207, such as contact openings 207, in the sacrificial conformal material 205. In an embodiment, a high temperature material 213 may be formed within the openings 207, and may be formed on a top surface of the sacrificial conformal material 205 (FIG. 2c).

Figure 2D:
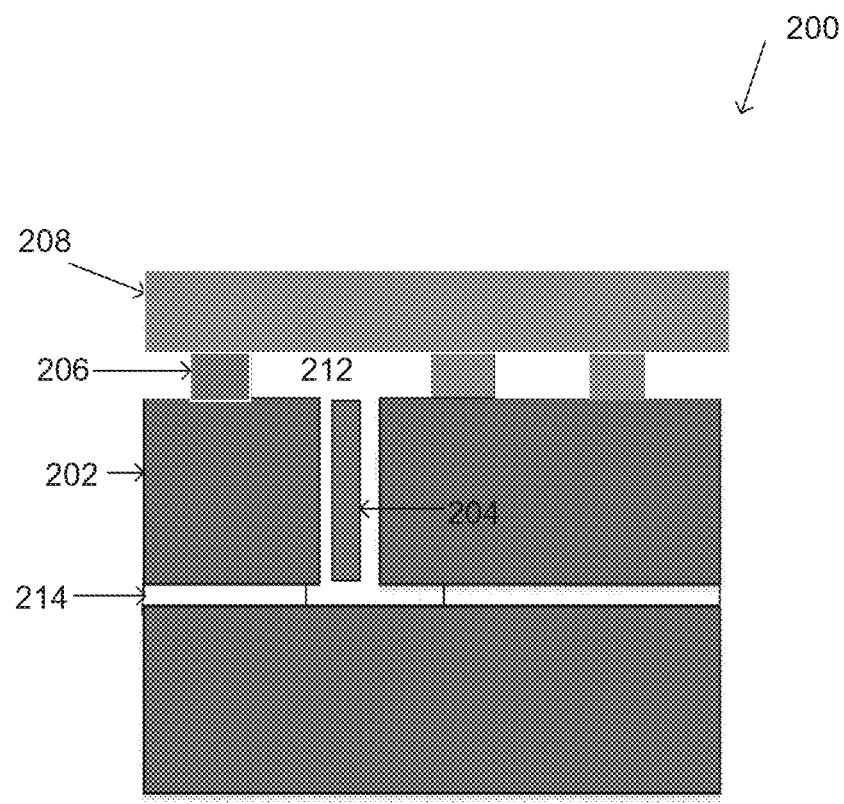

In an embodiment, the high temperature material 213 may comprise an epitaxially grown material, such as an epitaxial material comprising silicon, for example, and may be formed/grown at a temperature between about 500 to about 1000 degrees Celsius. In an embodiment, the high temperature material 213 may be patterned and etched to form desired features according to the particular application. The sacrificial conformal material 205 may be subsequently removed from the substrate 200 using any suitable removal/etching technique (FIG. 2d). In an embodiment, the sacrificial conformal material 205 may be removed utilizing a vapor HF etching process, for example. In an embodiment, pillar structures 206 and an upper portion 208 comprising the high temperature material may be formed.

A gap (which may comprise an air gap) may exist around the moveable element 204 and between the pillar structures 206. The pillar structures 206 and the upper portion 208 of the high temperature material may provide a seal for the substrate 200 comprising the MEMS devices, and may further comprise a hermetic seal. The high temperature material may surround a perimeter of the first substrate comprising the MEMS devices in an embodiment.

Figure 2E:
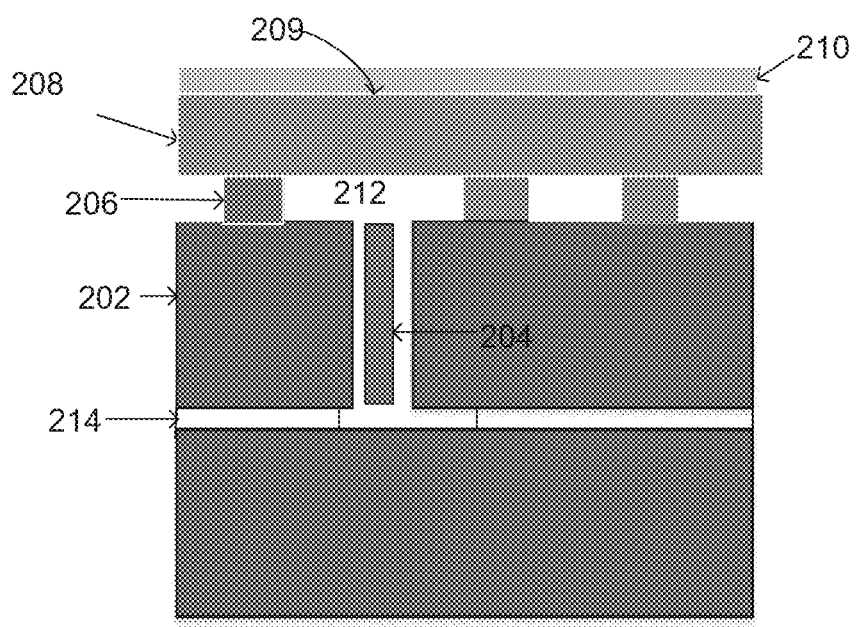

A bonding layer 210 may be formed on a top surface 209 of the upper portion 208 of the high temperature material (FIG. 2e). The bonding layer 210 may comprise any suitable material with which to bond the first substrate 200, with another substrate, by utilizing a bonding process, such as a layer transfer process. In an embodiment, the bonding layer 210 may comprise a dielectric layer, such as a chemical vapor deposition (CVD) dielectric material or a thermally grown oxide or nitride material. In another embodiment, the bonding layer 210 may comprise a polished silicon material, or a conductive material, such as a metal.

Figure 2F:
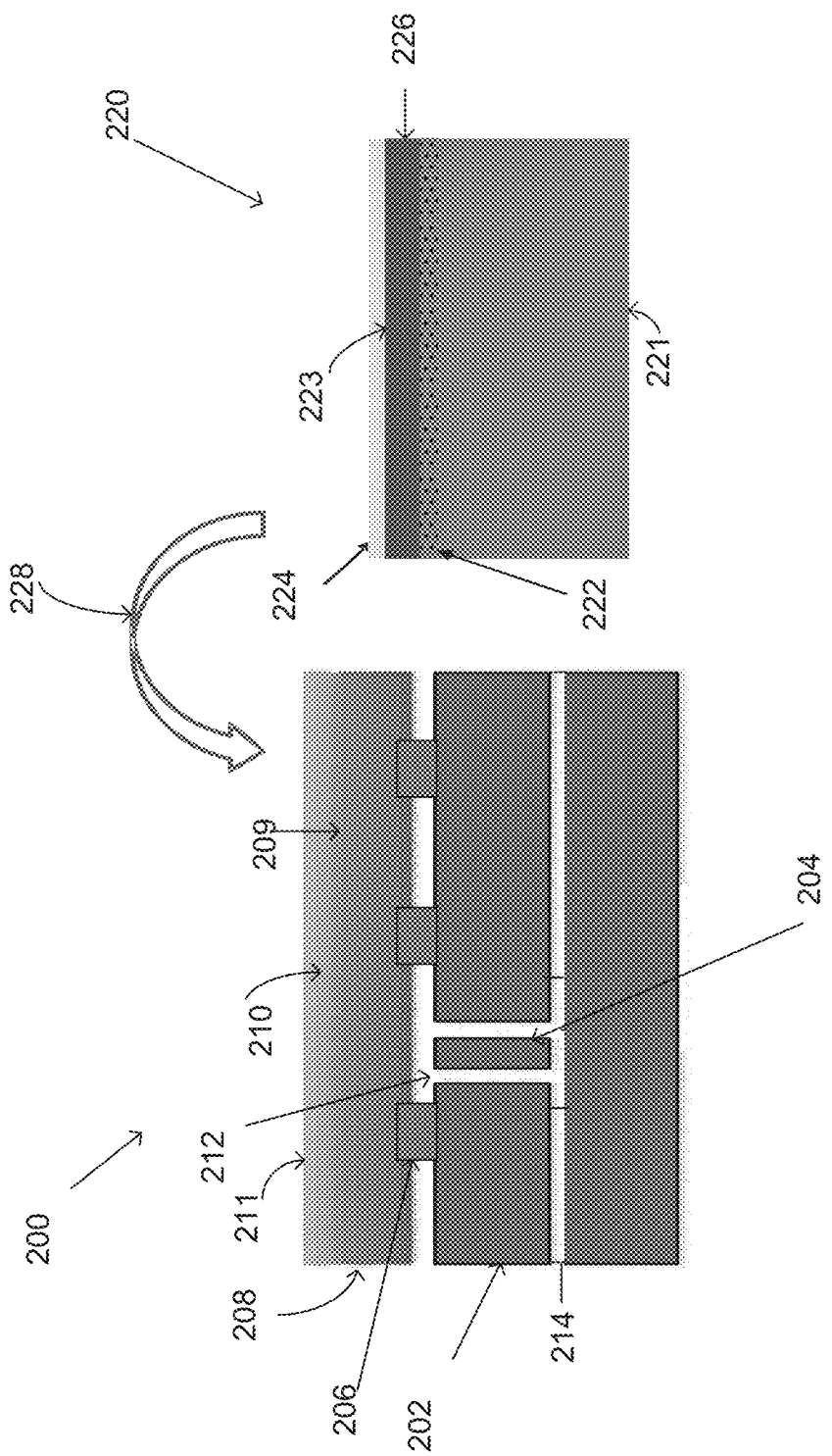

In an embodiment, the first substrate 200 may be bonded to a second substrate 220 (FIG. 2f). In an embodiment, a top surface of a second bonding layer 224 disposed on a device layer 226 of the second substrate 220 may be bonded with the top surface 211 of the first bonding layer 210 utilizing a layer transfer process 228. In an embodiment, the second bonding layer 224 may comprise any material that is capable of bonding with the first bonding layer 210. In an embodiment, the second bonding layer 224 may comprise such materials as a dielectric material, such as a CVD or a thermally grown oxide or nitride material, a polished silicon material, or a conductive material. The second substrate 220 may further comprise a separating layer 222, which may comprise an ion implanted layer, such as a hydrogen implanted layer, in some cases, wherein the separating layer 222 may be cleaved/separated from a donor portion 221 of the second substrate 220.

Figure 2G:
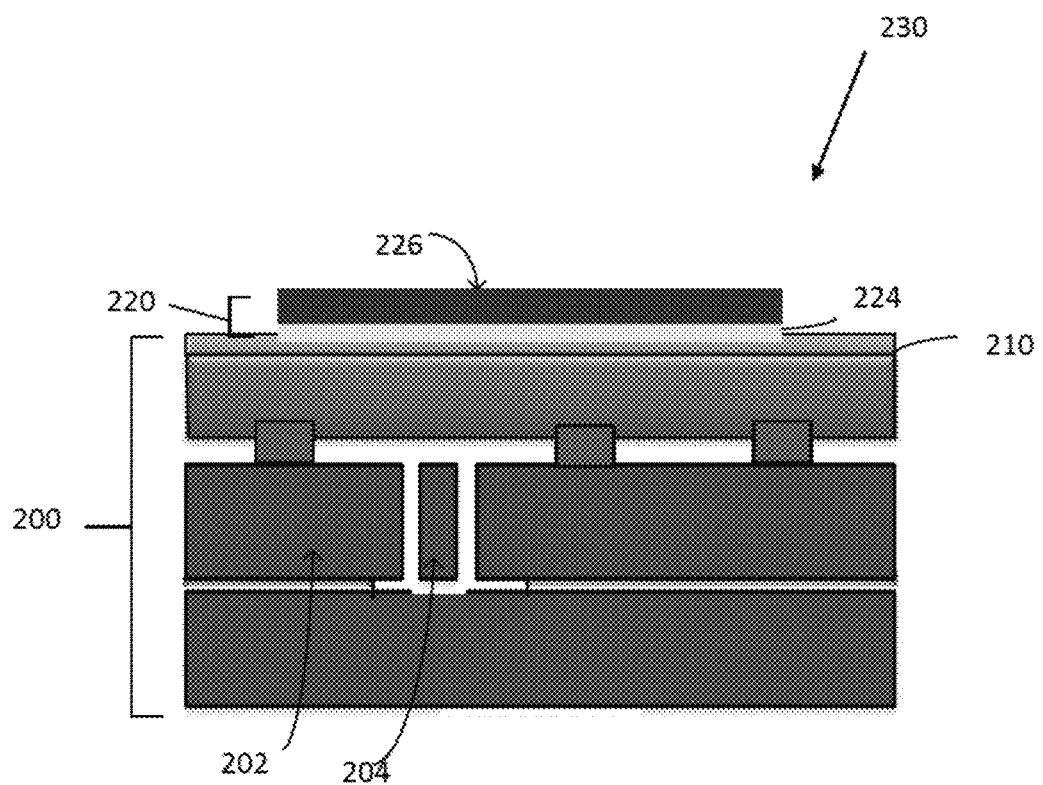

In an embodiment, the second substrate 220 may be layer transferred utilizing the layer transfer process 228 to bond with the first substrate 200, wherein the device layer 226 is joined to the first substrate 200 by the bonding between the first and second bonding layers 210, 224 (FIG. 2g). The donor portion 221 of the second substrate 220 may be removed/separated from the second substrate 220 by cleaving the donor portion 221 at the separating layer 222. Thus, an integrated MEMS device/structure 230 may be formed, wherein the formation of the MEMS structures are decoupled from the device layer 226 fabrication. The device layer 226 may comprise any type of device, such as a CMOS device, an RF IC, a high voltage IC etc.

In an embodiment, further patterning and etching may be performed on the integrated MEMS device 130, wherein conductive contacts may be formed between portions of the MEMS structures of the first substrate 200 and portions/devices of the device layer 226 of the second substrate 220. For example, conductive contact structures may be formed between at least one of a transistor, a capacitor and a resistor of the device layer 226 and the moveable element 204 of the first substrate 200. In an embodiment, the bonding layers 210, 224 may provide isolation for such conductive contact structures. In an embodiment, the integrated MEMS device 130 may be further coupled with additional devices/die, and may comprise a portion of a system on a chip, either alone or combined with additional chips/devices so coupled, in some embodiments.

Figure 2H:
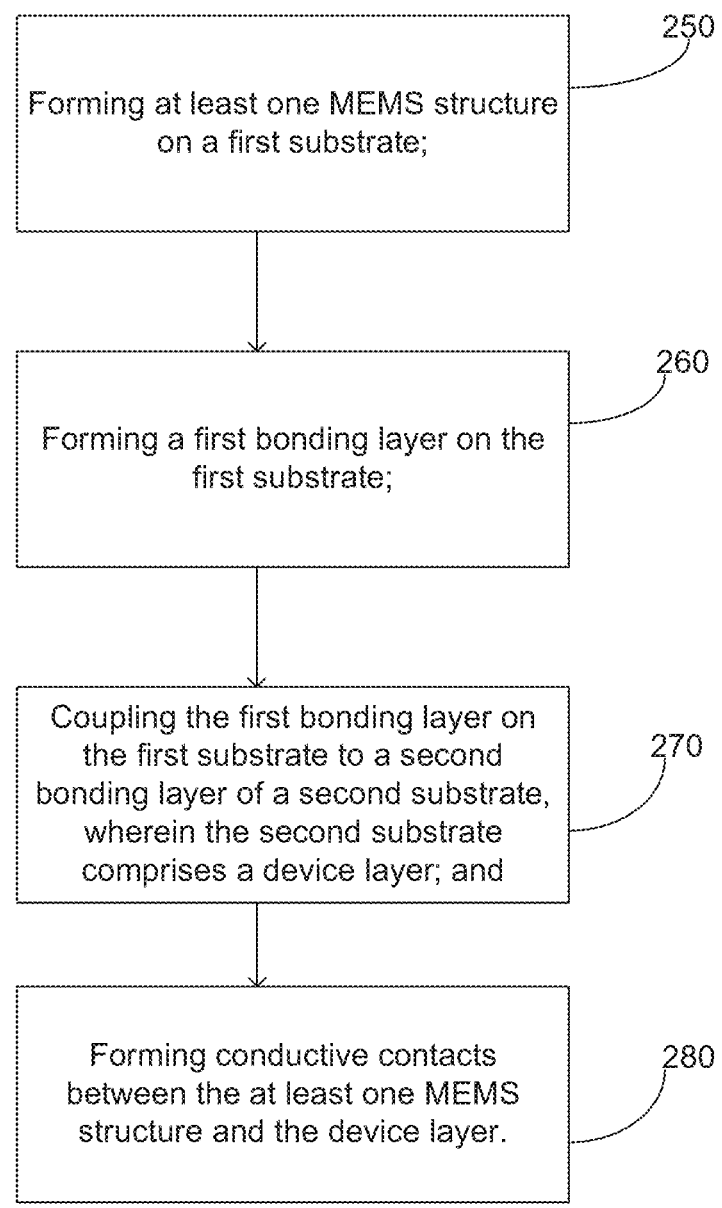
FIG. 2h represents a flow chart of a method according to embodiments.

FIG. 2h depicts a flow chart of a method of forming an integrated MEMS structure according to another embodiment. At step 250, at least one MEMS structure may be formed on a first substrate. At step 260 a first bonding layer may be formed on the first substrate. At step 270, the first bonding layer on the first substrate may be coupled to a second bonding layer of a second substrate, wherein the second substrate comprises a device layer. At step 280, conductive contacts maybe formed between the at least one MEMS structure and the device layer. In an embodiment, the device layer may comprise one of a microelectronic memory die and a central processing unit die in some cases, but may comprise any type of suitable device 114 according to the particular application in other cases. In an embodiment, the device layer may be further coupled with a package structure, such as an organic core package, and a coreless, bumpless build up layer (BBUL) package structure.

In an embodiment, the device layer may be coupled with any suitable type of package structures capable of providing electrical communications between a microelectronic device, such as a die and a next-level component to which the package structures may be coupled (e.g., a circuit board). In another embodiment, the device layer may be coupled with a package structure that may comprise any suitable type of package structures capable of providing electrical communication between a die and an upper integrated circuit (IC) package coupled with the device layer.

A device layer described in the various Figures herein may comprise a silicon logic die or a memory die, for example, or any type of suitable microelectronic device/die. In some embodiments the device layer may further comprise a plurality of dies, which may be stacked upon one another, depending upon the particular embodiment. In some cases the die(s) of the device layer may be located/attached/embedded on either the front side, back side or on/in some combination of the front and back sides of a package structure. In an embodiment, the die(s) may be partially or fully embedded in a package structure of the embodiments.

The various embodiments of the integrated MEMS structures included herein enable the decoupling of device fabrication, such as CMOS fabrication, and MEMS fabrication. The embodiments also allow for the continued decrease in scale of device layer circuitry without impacting MEMS feature size. By decoupling MEMS fabrication, hermetic seal formation is enabled because of the incorporation of a high temperature epitaxial seal. High voltage IC's with select sensors utilizing non-Silicon CMOS, as well as RF filters and RF switch applications are enabled, which may operate above about 31.8 GHz, for example. Inertial sensors such as accelerometers and gyroscopes can be implemented with a chipset or a system on a chip. Timing resonators are enabled that may be buried under the CMOS for use in mobile communication IC's for lower power applications and improved system performance.

Figure 3:
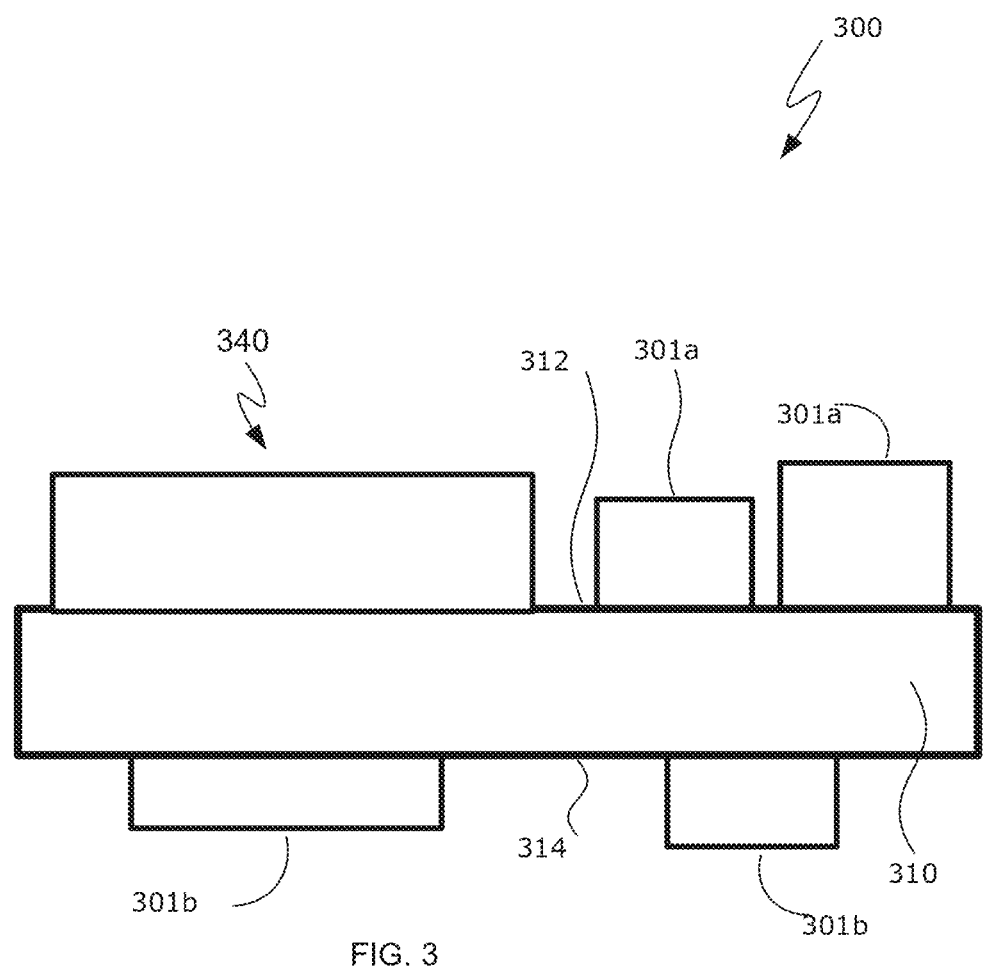
FIG. 3 represents a cross-sectional view of a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 disposed on the mainboard's first side 312, wherein the package structure 340 may comprise any of the integrated MEMS structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301*a* may be disposed on the first side 312 of the mainboard 310, and components 301*b* may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
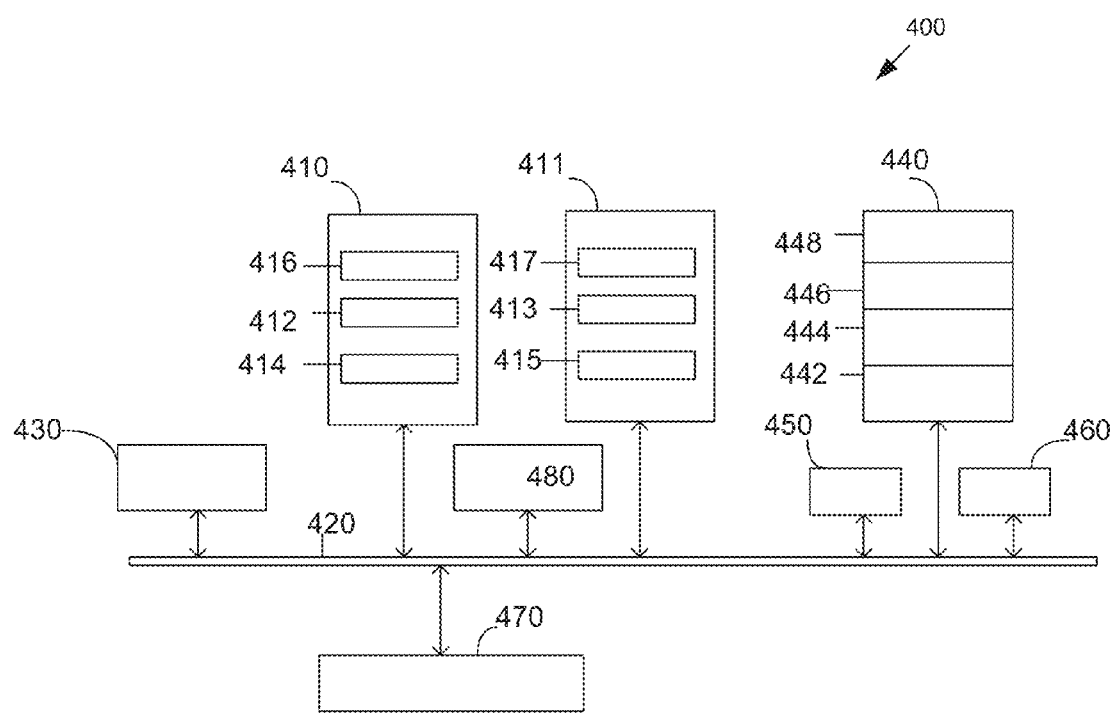
FIG. 4 represents a schematic of a system according to embodiments.

FIG. 4 is a schematic of a computer system 400 according to an embodiment. The computer system 400 (also referred to as the electronic system 400) as depicted can embody/include a package structure/integrated MEMS structure that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a handheld reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A structure comprising:
   a first substrate comprising at least one MEMS structure; wherein the first substrate comprises an upper portion and a lower portion, and wherein the at least one MEMS structure includes at least one fixed element that is bonded to the lower portion of the first substrate and at least one moveable element;
   a first bonding layer disposed directly on the upper portion of the first substrate;
   at least one pillar structure that is in contact with at least one fixed element, and wherein the at least one pillar structure is disposed between the upper portion of the first substrate and a lower portion of the first substrate, wherein the at least one pillar structure and the upper portion of the first substrate comprise an hermetic seal for the at least one MEMS structure; and
   a second bonding layer disposed on a surface of a second substrate, wherein the second bonding layer is disposed on a device layer of the second substrate, and wherein the first bonding layer is directly bonded to the second bonding layer.

2. The structure of claim 1 further comprising wherein the first bonding layer comprises one of a metal layer or an oxide layer.

3. The structure of claim 1 further comprising wherein the at least one MEMS structure comprises at least one of a resonator, an actuator, a gyroscope, a sensor, an accelerometer, and a compass.

4. The structure of claim 1 further comprising wherein the first substrate comprises a single crystal silicon substrate.

5. The structure of claim 1 further comprising wherein the upper portion of the first substrate and the pillar structure comprise an epitaxial material.

6. The structure of claim 1 further comprising wherein the second substrate comprises at least one microelectronic die.

7. The structure of claim 1 further comprising wherein the bond between the first bonding layer and the second bonding layer comprises one of a metal to metal bond or an oxide to oxide bond.

8. The structure of claim 1 further comprising wherein the second substrate comprises one of a high voltage IC and an RF IC.

9. The structure of claim 1 further comprising wherein the first substrate comprises a silicon on insulator substrate.

10. The structure of claim 1 further comprising wherein at least one of the MEMS structures are coupled to the device layer by conductive contacts disposed between portions of individual device structures within the device layer and the MEMS structures.

11. The structure of claim 1 wherein the second substrate further comprises at least one of a CPU and a memory die.

12. The structure of claim 1 wherein the second substrate further comprises a portion of a system on a chip.

13. The structure of claim 1 further comprising a system comprising:
   a bus communicatively coupled to the structure; and
   an eDRAM communicatively coupled to the bus.

14. The structure of claim 1, wherein the first bonding layer comprises a dielectric material, and does not comprise a conductive element.

* * * * *